US 8,334,219 B2

(12) United States Patent
Lee et al.

(10) Patent No.: US 8,334,219 B2
(45) Date of Patent: Dec. 18, 2012

(54) METHOD OF FORMING STRESS-TUNED DIELECTRIC FILM HAVING SI-N BONDS BY MODIFIED PEALD

(75) Inventors: Woo-Jin Lee, Tama (JP); Kuo-Wei Hong, Tama (JP); Akira Shimuzu, Sagamihara (JP)

(73) Assignee: ASM Japan K.K., Tokyo (JP)

( * ) Notice: Subject to any disclaimer, the term of this patent is extended or adjusted under 35 U.S.C. 154(b) by 400 days.

(21) Appl. No.: 12/832,739

(22) Filed: Jul. 8, 2010

(65) Prior Publication Data

US 2011/0014795 A1 Jan. 20, 2011

Related U.S. Application Data

(60) Provisional application No. 61/225,800, filed on Jul. 15, 2009.

(51) Int. Cl.
*H01L 21/31* (2006.01)

(52) U.S. Cl. ........ 438/761; 438/199; 438/294; 438/717; 257/293; 257/369; 257/412; 257/E21.293

(58) Field of Classification Search .................. 438/199, 438/294, 300, 592, 717, 761; 257/293, 369, 257/412–413, E21.293, E21.409
See application file for complete search history.

(56) References Cited

U.S. PATENT DOCUMENTS

| 6,743,738 B2 * | 6/2004 | Todd ............................. 438/778 |
| 7,981,751 B2 * | 7/2011 | Zhu et al. ...................... 438/300 |
| 2012/0220139 A1 * | 8/2012 | Lee et al. ...................... 438/792 |

* cited by examiner

*Primary Examiner* — Evan Pert
*Assistant Examiner* — Mark A Laurenzi
(74) *Attorney, Agent, or Firm* — Snell & Wilmer L.L.P.

(57) ABSTRACT

A method of forming stress-tuned dielectric films having Si—N bonds on a semiconductor substrate by modified plasma enhanced atomic layer deposition (PEALD), includes: introducing a nitrogen-and hydrogen-containing reactive gas and an additive gas into a reaction space inside which a semiconductor substrate is placed; applying RF power to the reaction space using a high frequency RF power source and a low frequency RF power source; and introducing a hydrogen-containing silicon precursor in pulses into the reaction space wherein a plasma is excited, thereby forming a stress-tuned dielectric film having Si—N bonds on the substrate.

20 Claims, 8 Drawing Sheets

US 8,334,219 B2

METHOD OF FORMING STRESS-TUNED DIELECTRIC FILM HAVING SI-N BONDS BY MODIFIED PEALD

CROSS-REFERENCE TO RELATED APPLICATIONS

This application claims the benefit of U.S. Provisional Application No. 61/225,800, filed Jul. 15, 2009, and the disclosure of which is herein incorporated by reference in its entirety.

BACKGROUND

1. Field of the Invention

The present invention relates to semiconductor integrated circuit manufacturing and, more particularly, to a method of forming stress-tuned silicon nitride thin films and to a method of depositing the silicon nitride films using plasma enhanced atomic layer deposition (PEALD) at low temperature (under, e.g., 400° C.).

2. Description of the Related Art

Silicon nitride layers deposited at low temperatures (less than 400° C.) have been used in a number of important applications for memory devices, for example, as a passivation layer, a surface protection layer and/or a spacer for a transistor gate. Silicon nitride films may be formed by plasma enhanced chemical vapor deposition (PECVD) method. The main advantages of the PECVD method over other CVD methods are high deposition rates and controllability over a wide range of refractive indices. A further advantage of the PECVD method is that the process can take place at a relatively low temperature, for example temperatures under 400° C., keeping the total thermal budget of the cell processing to a minimum.

In recent years, silicon nitride layers have been used in structures which improve the carrier mobility in n-p channel MOSFET devices having different stress (some exhibiting tensile stress and some exhibiting compressive stress) as shown in U.S. 2003/0040158 A1 by Saitoh. Preferably, a silicon nitride layer which has tensile stress is formed by a low pressure CVD process, and a silicon nitride layer which has compressive stress is formed by PECVD process. According to the technology disclosed by Saitoh, in order to produce silicon nitride layers having adverse stress characteristics, entirely different deposition methods must be used.

In an embodiment, the present invention provides a method of forming stress-tuned silicon nitride thin films using plasma enhanced atomic layer deposition (PEALD) at low temperature (under, e.g., 400° C.).

SUMMARY

An object of an embodiment of the present invention is to provide a method of forming stress tuned (e.g., −2.0 GPa~1.5 GPa) dielectric layers having Si—N bonds, such as a silicon nitride layer, for an integrated circuit at low temperatures, such as temperatures below 400° C. Another object of an embodiment of the present invention is to provide a method of depositing the film by manipulating dual frequency power in the modified PEALD process.

In one embodiment of the invention, a method of forming a stress tuned dielectric thin film having Si—N bonds on a semiconductor substrate by modified PEALD is provided. The method comprises introducing a nitrogen- and hydrogen-containing reactive gas and an additive gas (e.g., a rare gas) into a reaction space inside which the semiconductor substrate is placed, and applying dual RF (high frequency and low frequency) power to the reaction space. A hydrogen-containing silicon precursor is then introduced in pulses of less than 5-second duration into the reaction space whereby a plasma is excited, thereby forming a stress tuned dielectric film having Si—N bonds on the substrate.

In this disclosure, "gas" may include vaporized solid and/or liquid. In this disclosure, "having Si—N bonds" may refer to being characterized by Si—N bonds, being constituted mainly or predominantly by Si—N bonds, being categorized in Si—N films, and/or having a main skeleTorr substantially constituted by Si—N bonds. In this disclosure, the reactive gas, the additive gas, and the hydrogen-containing silicon precursor may be different from each other or mutually exclusive in terms of gas types, i.e., there is no overlap of gases among these categories. Further, in this disclosure, any ranges indicated may include or exclude the endpoints.

In another embodiment, a method of forming a stress tuned dielectric thin film having Si—N bonds on a semiconductor substrate by modified PEALD, comprises: introducing a reactive gas and an additive gas into a CVD reaction chamber inside which a semiconductor substrate is placed wherein the semiconductor substrate temperature is maintained in the range of about 0° C. to about 400° C. After the reactive and additive gases are introduced into the reaction chamber, a plasma exciting condition is provided in the reaction chamber. A hydrogen-containing silicon precursor is then introduced into the reaction chamber in pulses using a pulse flow control valve, wherein the silicon precursor is introduced into the reaction chamber where the plasma is excited, thereby forming a dielectric thin film having Si—N bonds on the substrate by plasma reaction of the gases.

In still another embodiment, a stress tuned dielectric thin film having Si—N bonds is deposited in a PEALD chamber with a dual RF power input source that operates by supplying RF power having different frequency ranges. Typically, a high-frequency power input source operates by supplying RF power at a frequency exceeding 5 MHz (e.g. a high RF frequency power of 13.56 MHz or 27 MHz can be used). A low-frequency power input source operates by supplying RF power at a frequency within a range of about 400 kHz to about 500 kHz. In some embodiments, the ratio of low-frequency power to high-frequency power may be 0% to 100%.

In an embodiment, the high-frequency power may be introduced using an RF power (HRF) input in a range of about 0.01 W/cm$^2$ to about 0.3 W/cm$^2$; more typically in a range of about 0.04 W/cm$^2$ to about 0.15 W/cm$^2$. The low-frequency power may be introduced using an RF power (LRF) input in a range of 0 W/cm$^2$ to about 0.3 W/cm$^2$; more typically in a range of 0 W/cm$^2$ to about 0.15 W/cm$^2$.

In yet another embodiment, a hydrogen-containing silicon precursor may be composed of: a combination of silicon and hydrogen; a combination of silicon, hydrogen, and nitrogen; or a combination of silicon, hydrogen, carbon, and nitrogen. In an embodiment, the vaporized hydrogen-containing silicon precursor may be introduced in pulses having a duration of about 0.1 sec to about 1.0 sec with an interval between pulses of about 0.5 sec to about 3 sec while maintaining plasma polymerization. In an embodiment, the reaction gas may be a combination of nitrogen gas and hydrogen gas or a combination of ammonia gas and hydrogen gas. In an embodiment, the additive gas may be selected from the group consisting of He, Ar, Kr, Xe, and the molar flow rate of the additive gas may be greater than the molar flow rate of the hydrogen-containing silicon source. In an embodiment, the reaction chamber may be maintained at a pressure of about 0.1 Torr to about 10 Torr.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

DETAILED DESCRIPTION

Figure 1:
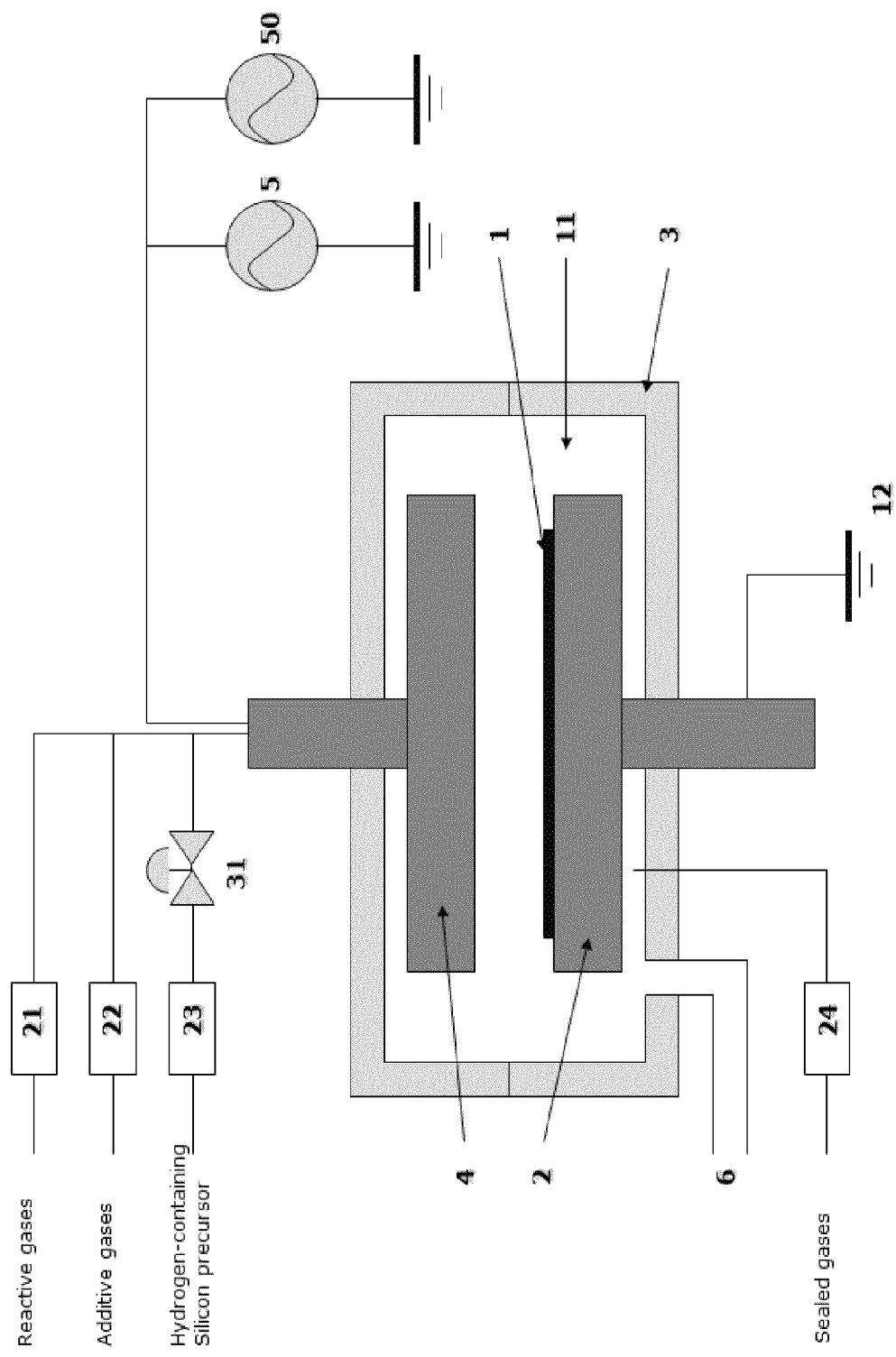
FIG. 1 is a schematic representation of a PEALD apparatus for depositing a dielectric layer having Si—N bonds according to one embodiment of the present invention.

The present invention is described with reference to embodiments which are not intended to limit the present invention. Additionally, an element applied in an embodiment may freely be applicable to other embodiments, and elements applied in different embodiments may mutually be replaceable or interchangeable unless special conditions are attached thereto. Further, the ranges indicated below may include or exclude the endpoints in embodiments.

In an embodiment of the invention, a method of forming a stress-tuned dielectric thin film having Si—N bonds on a semiconductor substrate by PEALD, which comprises; (a) introducing a nitrogen- and hydrogen-containing reactive gas and an additive gas into a reaction space inside which the semiconductor substrate is placed; (b) applying dual RF (high frequency and low frequency) power to the reaction space; and (c) introducing a hydrogen-containing silicon precursor in pulses having a less than 5-second duration with given intervals into the reaction space wherein a plasma is excited, thereby forming a stress-tuned dielectric film having Si—N bonds on the substrate.

In an embodiment, a stress-tuned dielectric thin film having Si—N bonds is deposited in a PEALD chamber with a dual RF power input source that operates by supplying RF power having different frequency ranges. Typically, a high-frequency power input source is operated at a frequency exceeding 5 MHz (e.g. a high RF frequency power of 13.56 MHz or 27 MHz can be used). A low-frequency power input source is operated at a frequency within a range of about 400 kHz to about 500 kHz. In some embodiments, the ratio of low-frequency power to high-frequency power may be 0 to 100%.

In any of the foregoing embodiments, the high-frequency power is introduced using an RF power input in a range of about 0.01 W/cm$^2$ to about 0.3 W/cm$^2$; more typically in a range of about 0.04 W/cm$^2$ to about 0.15 W/cm$^2$. The low-frequency power is introduced using an RF power input in a range of 0 W/cm$^2$ to about 0.3 W/cm$^2$; more typically in the range of 0 W/cm$^2$ to about 0.15 W/cm$^2$.

One of the disclosed embodiments provides a method of forming a target dielectric film having Si—N bonds constituting a main structure of the film on a semiconductor substrate by plasma enhanced atomic layer deposition (PEALD), said target dielectric film having stress which is either tensile or compressive as its stress type which is opposite to a stress type of a reference dielectric film having Si—N bonds constituting a main structure of the film on a semiconductor substrate by PEALD, comprising: (i) introducing a reactive gas containing nitrogen and hydrogen, and a rare gas into a reaction space inside which the semiconductor substrate is placed; (ii) applying to the reaction space RF power which is a mixture of low-frequency RF power (LRF) and high-frequency RF power (HRF) at a ratio of LRF/HRF to obtain the target dielectric film having the stress type opposite to that of the reference dielectric film, said ratio being set by increasing a ratio of LRF/HRF used for the reference dielectric film when the stress type of the reference dielectric film is tensile, or by decreasing a ratio of LRF/HRF used for the reference dielectric film when the stress type of the reference dielectric film is compressive; and (iii) introducing a hydrogen-containing silicon precursor in pulses into the reaction space while the RF power is applied, thereby forming by PEALD the target dielectric film on the semiconductor substrate, wherein as a result of the set ratio, the target dielectric film has the stress type opposite to that of the reference dielectric film.

In some embodiment, the ratio of LRF/HRF is a primary parameter for controlling the stress type of the target dielectric film. In some embodiments, the ratio of LRF/HRF is the sole parameter for controlling the stress type of the target dielectric film.

In some embodiments, the target dielectric film has compressive film stress, and in step (ii), the ratio of LRF/HRF is set by increasing the ratio of LRF/HRF used for the reference dielectric film, wherein the increased ratio of LRF/HRF is 2/10 to 10/10. Alternatively, in some embodiments, the target dielectric film has tensile film stress, and in step (ii), the ratio of LRF/HRF is set by decreasing the ratio of LRF/HRF used for the reference dielectric film, wherein the decreased ratio of LRF/HRF is 0/10 to 4/10.

In some embodiment, the hydrogen-containing silicon precursor is introduced in pulses having a pulse duration of about 0.1 sec to about 1.0 sec with an interval of about 0.5 sec to about 3 sec while forming the films.

Another of the disclosed embodiments provides a method of forming a target dielectric film having Si—N bonds constituting a main structure of the film on a semiconductor substrate by plasma enhanced atomic layer deposition (PEALD), said target dielectric film having a film stress value different from that of a reference dielectric film having Si—N bonds constituting a main structure of the film on a semiconductor substrate by PEALD, comprising: (i) introducing a reactive gas containing nitrogen and hydrogen, and a rare gas into a reaction space inside which the semiconductor substrate is placed; (ii) applying to the reaction space RF power which is a mixture of low-frequency RF power (LRF) and high-frequency RF power (HRF) at a ratio of LRF/HRF to obtain the stress type opposite to that of the reference dielectric film, said ratio being set by increasing a ratio of LRF/HRF used for the reference dielectric film to obtain the target dielectric film having a film stress value which is lower than that of the reference dielectric film, or by decreasing a ratio of LRF/HRF used for the reference dielectric film to obtain a film stress value which is higher than that of the reference dielectric film; and (iii) introducing a hydrogen-containing silicon precursor in pulses into the reaction space while the RF power is applied, thereby forming by PEALD the target dielectric film on the semiconductor substrate, wherein the ratio of LRF/HRF is used as a primary parameter for differentiating the film stress value of the target dielectric film from that of the reference dielectric film.

Still another of the disclosed embodiments provides a method of forming multiple dielectric films each having Si—N bonds constituting a main structure of the film on a semiconductor substrate by plasma enhanced atomic layer deposition (PEALD), wherein the multiple dielectric films include a tensile stress film and a compressive stress film, said method comprising: (i) introducing a reactive gas containing nitrogen and hydrogen, and a rare gas into a reaction space inside which the semiconductor substrate is placed; (ii) applying to the reaction space RF power which is a mixture of low-frequency RF power (LRF) and high-frequency RF power (HRF) at a ratio of LRF/HRF; (iii) introducing a hydrogen-containing silicon precursor in pulses into the reaction space while the RF power is applied, thereby forming by PEALD one of the tensile and compressive stress films on the semiconductor substrate; and (iv) as a primary parameter for controlling stress of the depositing film, changing the ratio of LRF/HRF, and repeating steps (i) to (iii) at the changed ratio of LRF/HRF, thereby forming another of the tensile and compressive stress films on the semiconductor substrate.

All or part of the features disclosed in the present disclosure can be used in any combinations in any of the disclosed embodiments.

In an embodiment, deposition of a dielectric film having Si—N bonds which is tuned to have a stress within a range of about −2.0 GPa (compressive) to about 1.5 GPa (tensile). If a compressive film is required, the dielectric film stress can be tuned or adjusted to be within a range of about 31 2.0 GPa to about −180 MPa. If a tensile film is required, the dielectric film stress can be tuned or adjusted to be within a range of about 40 MPa to 1.5 GPa.

In an embodiment, the hydrogen-containing silicon precursor may have a formula of $Si_\alpha H_\beta X_\gamma$, wherein $\alpha$, $\beta$ and $\gamma$ are integers and $\gamma$ includes zero. X can comprise N and/or $C_m H_n$, wherein m and n are integers. In an embodiment, $\alpha$ may be 1 to 5, $\beta$ may be 1 to 10, and $\gamma$ may be 0 to 6. In an embodiment, m may be 2 to 18, and n may be 6 to 30.

In any of the foregoing embodiments, the substrate may be kept at a temperature of 0° C. to 400° C. while the film is deposited thereon. In some embodiments, the substrate temperature is about 250° C. to about 350° C. during deposition.

In any of the foregoing embodiments, the hydrogen-containing silicon precursor may be introduced in pulses while the reactive gas and the additive gas are continuously introduced and the dual RF power is continuously applied.

In any of the foregoing embodiments, the hydrogen-containing silicon precursor may be introduced in pulses having a duration of about 0.1 sec to about 1.0 sec. In some embodiments, the pulses of the hydrogen-containing silicon precursor have a duration of about 0.2 sec to about 0.3 sec.

In some embodiments, the pulses of the hydrogen-containing silicon precursor are separated by intervals of about 0.1 sec to about 3.0 sec. In some embodiments, the intervals are about 0.5 sec to about 3.0 sec or 1.0 sec to about 2.0 sec. In an embodiment, the pulse duration may be equal to or shorter than the interval.

In any of the foregoing embodiments, the reactive gas may comprise a mixture of $N_2$ and $H_2$, a mixture of $NH_3$ and $H_2$, and a nitrogen-boron-hydrogen gas. In an embodiment, the reactive gas may comprise a mixture of $N_2$ and $H_2$ with a molar flow rate ratio of $N_2/H_2$ of about 1/1 to about 10/1. In some embodiments the molar flow rate ratio of $N_2$ and $H_2$ is about 2/1 to about 4/1. In an embodiment, the reactive gas may comprise a mixture of $NH_3$ and $H_2$ with a molar flow rate ratio of $NH_3/H_2$ of about 1:1 to about 1:10. In some embodiments, the molar flow rate ratio of $NH_3/H_2$ may be about 1:1 to about 1:3.

In any of the foregoing embodiments, the additive gas may be one or more gases selected from the group consisting of He, Ar, Kr, and Xe, and the molar flow rate of the additive gas may be greater than the molar flow rate of the hydrogen-containing silicon source. In an embodiment, a flow rate of the additive gas introduced into the reaction chamber may be about 30 sccm to 3000 sccm. In some embodiments, the flow rate of the additive gas may be about 1500 sccm to about 2500 sccm. In an embodiment, the additive gas may comprise a mixture of helium and argon or a mixture of helium and krypton. In an embodiment, the additive gas may comprise a mixture of helium and argon with a molar flow rate ratio of helium/argon of about 3/1 to about 20/1. In some embodiments, the molar flow rate ratio of helium/argon may be about 5/1 to about 15/1. In an embodiment, the additive gas may comprise a mixture of helium and krypTorr with a molar flow rate ratio of helium/krypTorr is about 5/1 to about 15/1.

In any of the foregoing embodiments, the reaction space pressure may be adjusted in a range of about 0.1 Torr to about 10 Torr. In some embodiment, the pressure in the reaction space may be about 2 Torr to about 9 Torr.

In any of the foregoing embodiments, the dielectric constant of the stress-tuned dielectric layer having Si—N bonds as deposited may be in a range of 4.5 to 7.5. In some embodiments, the dielectric constant may be about 6.5 to about 7.2.

In any of the foregoing embodiments, the hydrogen-containing silicon precursor may be vapor or liquid at room temperature. In some embodiments, the hydrogen-containing silicon precursor may be one or more compound selected from the group consisting of silane, disilane, trysilylamine, and bis(tert-butylamino)silane.

Embodiments are explained with reference to the drawings which are not intended to limit the present invention. FIG. 1 is a schematic view of an apparatus combining a plasma CVD reactor having flow control valves, which can be used in an embodiment of the present invention.

In this example, by providing a pair of electrically conductive flat-plate electrodes 4, 2 in parallel and facing each other in the interior 11 of a reaction chamber 3, applying HRF power (e.g., 13.56 MHz or 27 MHz) 5 and LRF power (e.g., 400 kHz~500 kHz) 50 to the electrode 4, and electrically grounding 12 the other electrode 2 or vice versa, a plasma is excited between the electrodes. A temperature regulator is provided in a lower stage (the lower electrode 2), and a temperature of a substrate 1 placed thereon is kept constant at a given temperature. The upper electrode 4 serves as a shower plate as well, and a reaction gas and an additive gas are introduced into the reaction chamber 3 through gas flow controllers 21 and 22, respectively, and the shower plate 4. A hydrogen-containing silicon precursor is introduced into the reaction chamber through a gas flow controller 23, a pulse flow control valve 31, and the shower plate 4. Additionally, in the reaction chamber 3, an exhaust pipe 6 is provided through which gas in the interior 11 of the reaction chamber 3 is constantly exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure).

For the pulse flow control valve 31, a pulse supply valve that is used for ALD (atomic layer deposition) can suitably be used in an embodiment.

Figure 2:
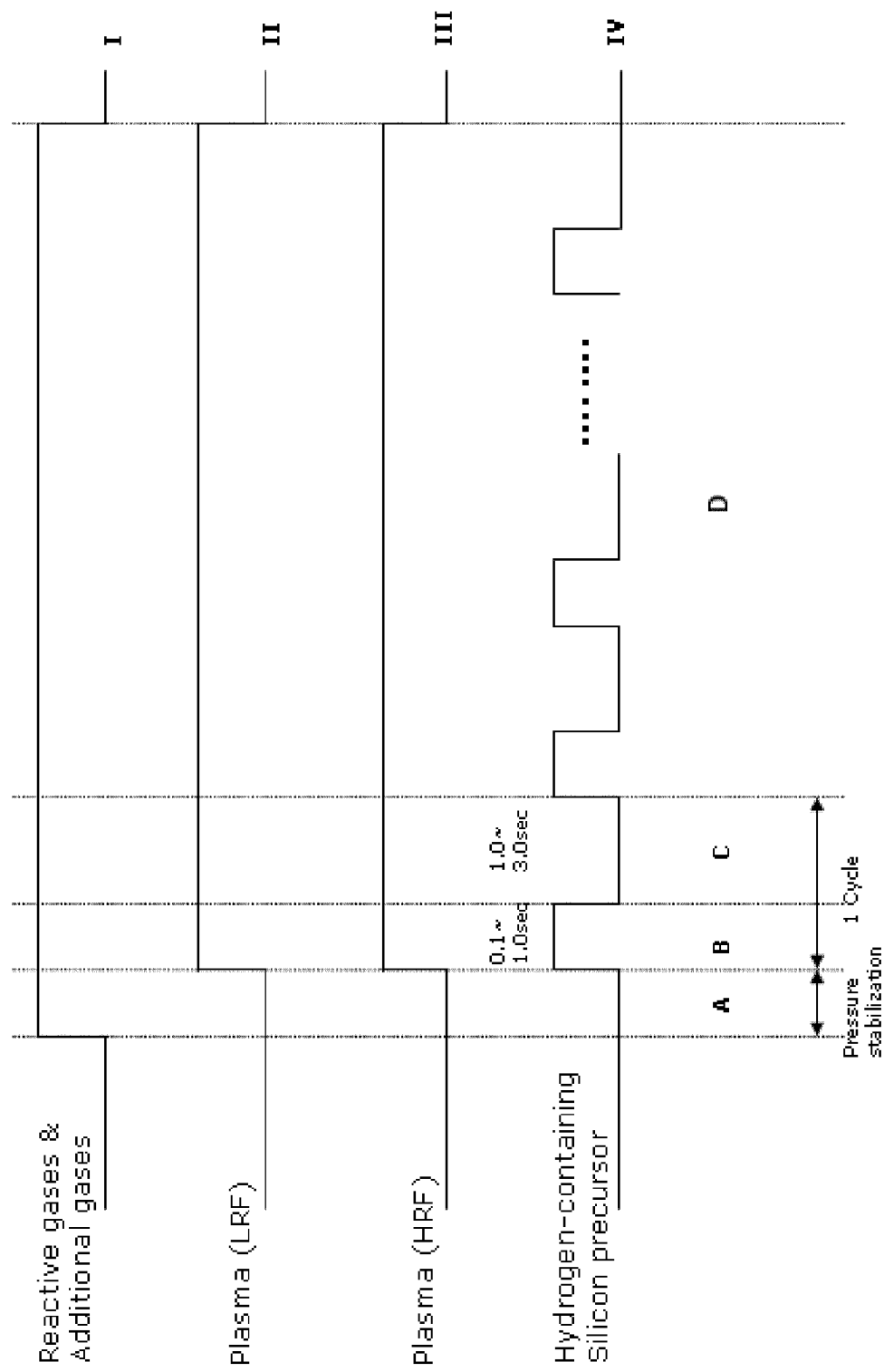
FIG. 2 is a schematic diagram showing process steps of a PEALD method according to an embodiment of the present invention for depositing stress-tuned dielectric layers having Si—N bonds.

FIG. 2 shows process steps according to an embodiment of the present invention method for depositing a stress-tuned silicon nitride films. In the embodiment of the present invention as shown FIG. 2 wherein a reactive gas and additive gas are introduced into the reaction chamber (pattern I), a silicon precursor is introduced into the reaction chamber through a pulse flow control valve for about 0.1 sec to about 1.0 sec which is then shut off for about 0.5 sec to about 3 sec as shown as pattern IV where a plasma is excited (by LRF and HRF as shown in patterns II and III, respectively) while supplying of the gases. In an embodiment, no other gas may be used.

That is, during a time period A (e.g., a duration of 1.0 sec to 10.0 sec), the reactive gas and the additive gas is introduced to stabilize the pressure of the reaction chamber. During a time period B, the hydrogen-containing silicon precursor is introduced while maintaining the flow of the reaction gas and additive gas. Also during the time period B, the HRF power and the LRF power are supplied so as to deposit an atomic layer by self-saturation reaction. During a time period C, the flow of the hydrogen-containing silicon precursor is stopped while maintaining the flow of the reactive gas, the flow of the additive gas, the supply of the HRF power, and the supply of the LRF power. The time period B and the time period C constitute one cycle, and during a time period D, multiple cycles are performed until a desired thickness of film is obtained.

The introduction of the silicon precursor in pulses is repeated by doing these, hydrogen-nitrogen bonds can be controlled which is believed to significantly enhance a stress of the deposited film and a large amount of hydrogen and nitrogen can be added to the process which is believed to significantly increase the Hx, Nx radicals during film growth, resulting in improving surface migration of the deposition material so as to form a stress-tuned and high-conformal silicon nitride film on a substrate.

In an embodiment, a thickness of layer deposited per cycle may be about 0.1 nm/cycle to about 1.0 nm/cycle, and the pulse supply of the silicon precursor is continued until a desired thickness of film (e.g., 5 nm to 20 nm) is obtained.

For forming stress-tuned dielectric layers having Si—N bonds on a semiconductor substrate, deposition conditions in an embodiment may be as follows:

Hydrogen-containing silicon precursor (e.g., Trisilylamine): 10~2000 sccm (e.g., 50~1000 sccm)

Reactive gas 1 (e.g., hydrogen): 200~2000 sccm (e.g., 500~1500 sccm)

Reactive gas 2 (e.g., nitrogen): 0~2000 sccm (e.g, 100~1500 sccm)

Reactive gas 3 (e.g., ammonia): 0~1000 sccm (e.g., 0~500 sccm)

Rare gas 1 (e.g., process helium): 0~5000 sccm (e.g., 500~3000 sccm)

Sealing gas (e.g., helium: Typically this does not constitute part of reaction or process gas): 200~700 sccm (e.g., 300~600 sccm)

Rare gas 2 (e.g., argon): 50~700 sccm (e.g., 200~600 sccm)

Substrate temperature: 0~400° C. (e.g., 100~350° C.)

High frequency RF power (per substrate upper surface area): 0.01 W/cm$^2$ to 0.3 W/cm$^2$ (e.g., 0.04 W/cm$^2$ to about 0.2 W/cm$^2$)

Low frequency RF power (per substrate upper surface area): 0~100% of high frequency RF power Precursor supply time: 0.1~0.7 sec supply (e.g., 0.2~0.5 sec), 0.1~4.0 sec supply stop (e.g., 0.4~2.0 sec) (e.g., the stop period is longer than the supply period)

The dielectric layer having Si—N bonds according to embodiments of the present invention may have a conformality of more than about 80% (preferably 90% or higher). The conformality is defined as a ratio of average thickness of a film formed on a side surface of a trench to average thickness of a film formed on a top surface. Stress can be tuned in a range of about −2.0 GPa (compressive) to about 1.5 GPa (tensile). Additionally, in another embodiment, the dielectric constant of a film depositing on the substrate may be about 6.7 to about 7.3 and the reflective index at 633 nm may be in a range of about 1.8 to about 2.5. The etching rate of deposited silicon nitride film according to an embodiment of the present invention as measured using buffered hydrogen fluoride may be about 2 times to about 10 times smaller than a conventional thermal silicon oxide film which is commonly used as a standard.

The present invention will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE 1

A dielectric layer having Si—N bonds was formed on a substrate under the conditions shown below using the sequence illustrated in FIG. 2 and the PEALD apparatus illustrated in FIG. 1.

Figure 3A:
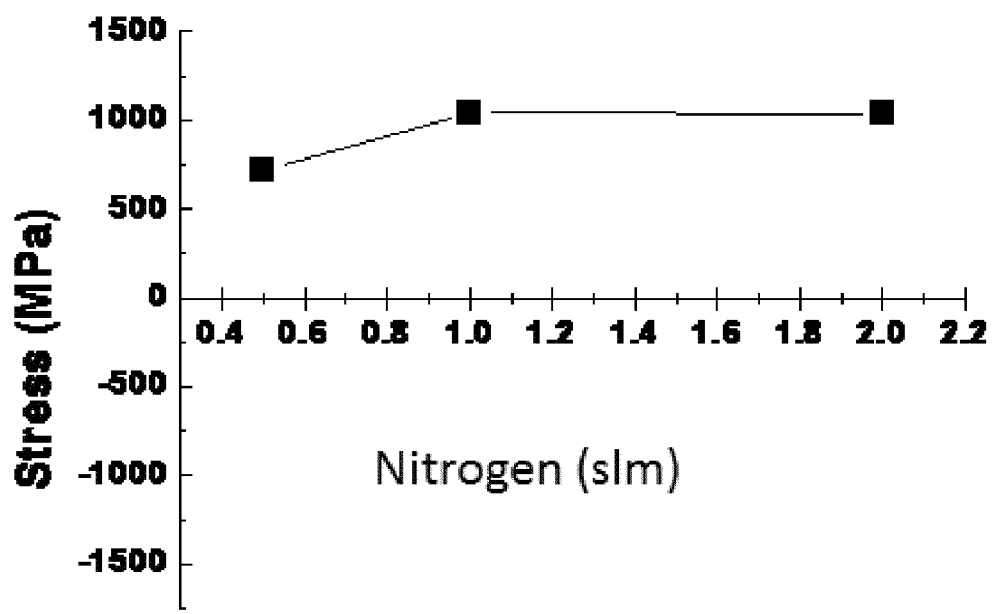
FIG. 3A is a graph showing film stress (MPa) of a dielectric layer having Si—N bonds according to an embodiment of the present invention, as a function of nitrogen flow (slm) during film deposition (with an HRF of 50 W).

Trisilylamine: 100 sccm
Hydrogen: 500 sccm
Nitrogen: 500, 1000, 2000 sccm
Process helium: 1400 sccm
Sealed helium: 500 sccm
Argon: 500 sccm
Substrate temperature: 350° C.
High frequency RF power (a frequency of 13.56 MHz): 0.07 W/cm$^2$
Low frequency RF power (a frequency of 430 kHz): 0.0 W/cm$^2$
Trisilylamine supply time: 0.3 sec supply, 2.0 sec supply stop FIG. 3A shows stress changes of deposited films with a nitrogen flow of 500, 1000, and 2000 sccm. Stress was tuned in a range of about 0.7 GPa (tensile) to about 1.0 GPa (tensile).

EXAMPLE 2

Figure 3B:
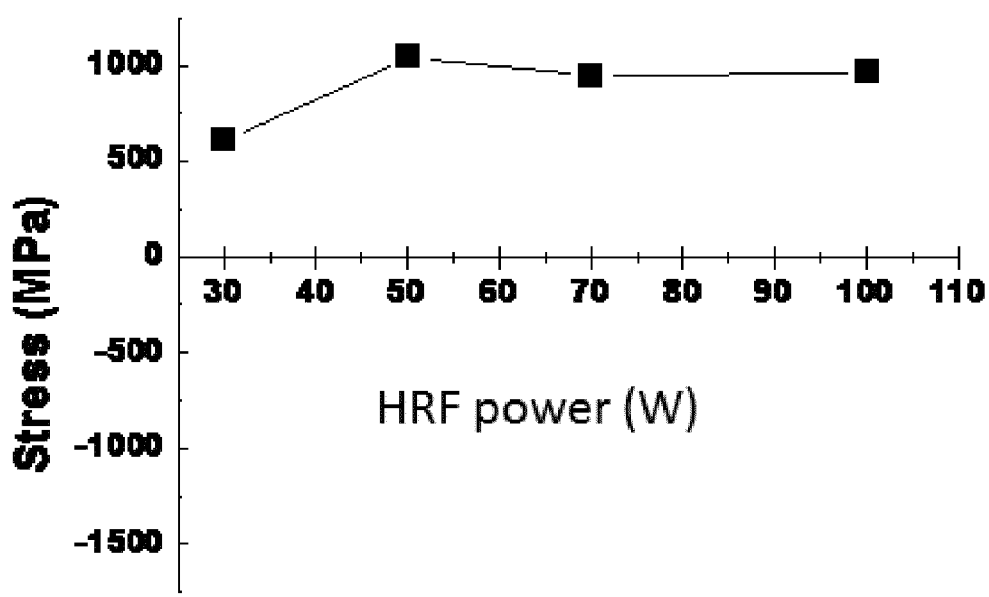
FIG. 3B is a graph showing film stress (MPa) of a dielectric layer having Si—N bonds according to an embodiment of the present invention, as a function of HRF power (W) during film deposition.

A dielectric layer having Si—N bonds was formed on a substrate under the condition shown below using the sequence illustrated in FIG. 2 and the PEALD apparatus illustrated in FIG. 1.
Trisilylamine: 100 sccm
Hydrogen: 500 sccm
Nitrogen: 1000 sccm
Process helium: 1400 sccm
Sealed helium: 500 sccm
Argon: 500 sccm
Substrate temperature: 350° C.
High frequency RF power (a frequency of 13.56 MHz): 0.043, 0.07, 0.1, 0.142 W/cm$^2$ (30, 50, 70, 100 W, respectively)
Low frequency RF power (a frequency of 430 kHz): 0.0 W/cm$^2$
Trisilylamine supply time: 0.3 sec supply, 2.0 sec supply stop FIG. 3B shows stress changes of deposited films with a high frequency RF power of 0.043, 0.07, 0.1, and 0.142 W/cm$^2$. Stress was tuned in a range of about 0.6 GPa (tensile) to about 1.0 GPa (tensile).

EXAMPLE 3

Figure 4:
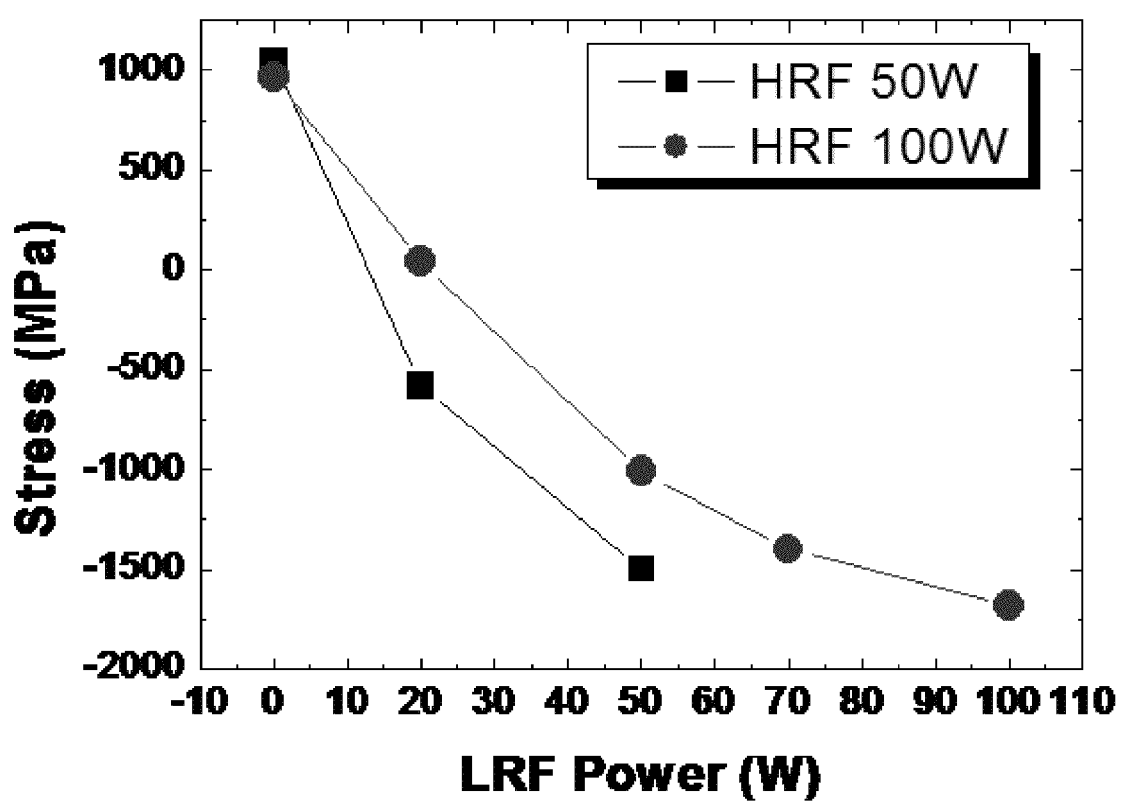
FIG. 4 is a graph showing film stress (MPa) of a dielectric layer having Si—N bonds according to an embodiment of the present invention, as a function of LRF power (W) with different HRF power during film deposition.

A dielectric layer having Si—N bonds was formed on a substrate under the condition shown below using the sequence illustrated in FIG. 2 and the PEALD apparatus illustrated in FIG. 1.
Trisilylamine: 100 sccm
Hydrogen: 500 sccm
Nitrogen: 1000 sccm
Process helium: 1400 sccm
Sealed helium: 500 sccm
Argon: 500 sccm
Substrate temperature: 350° C.
High frequency RF power (a frequency of 13.56 MHz): 0.07 W/cm$^2$ (50 W), 0.143 W/cm$^2$ (100 W)
Low frequency RF power (a frequency of 430 kHz): 0~100% of high frequency RF power
Trisilylamine supply time: 0.3 sec supply, 2.0 sec supply stop FIG. 4 is a graph showing the stress change of deposited films which were deposited under the conditions above. The films were deposited under a variety of different LRF power conditions to provide films having stress values ranging from −1496 MPa (compressive) to 1044 MPa (tensile) with an HRF of 0.07 W/cm$^2$, and from −1684 MPa (compressive) to 966 MPa (tensile) with an HRF of 0.142 W/cm$^2$.

EXAMPLE 4

Figure 5:
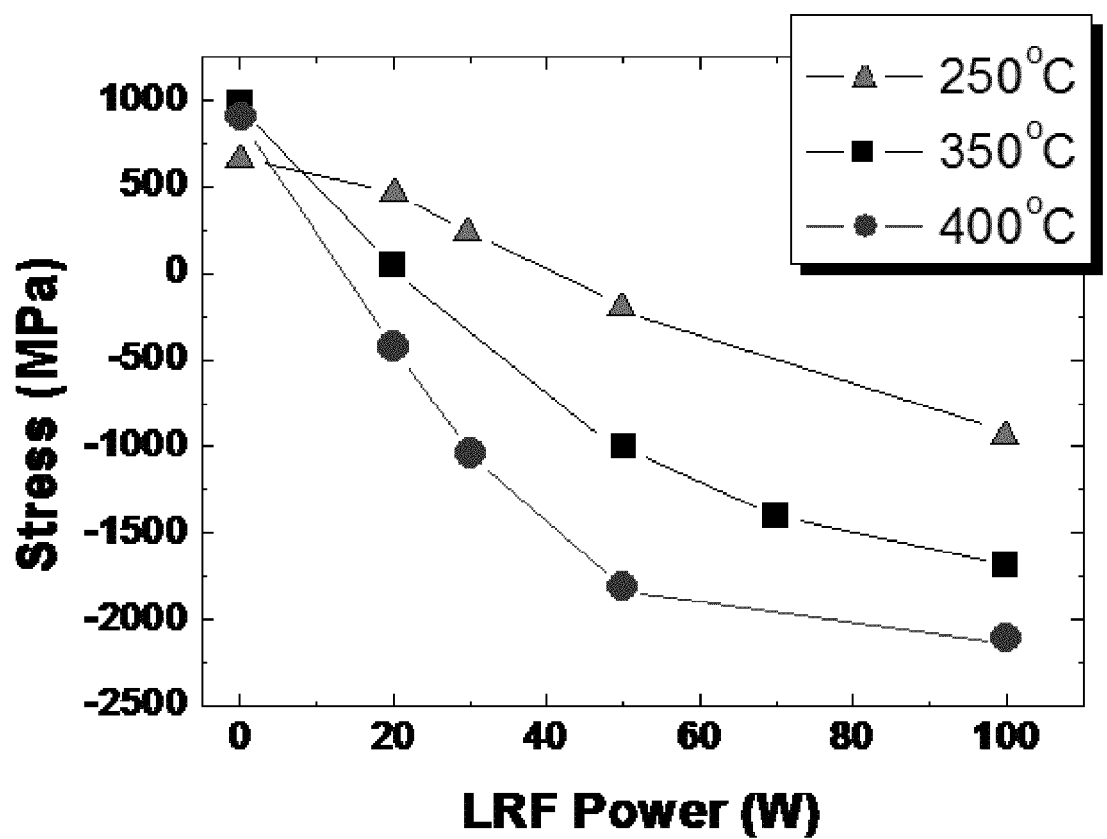
FIG. 5 is a graph showing film stress (MPa) of a dielectric layer having Si—N bonds according to an embodiment of the present invention, as a function of LRF power (W) with different deposition temperatures during film deposition (with an HRF of 100 W).

A dielectric layer having Si—N bonds was formed on a substrate under the condition shown below using the sequence illustrated in FIG. 2 and the PEALD apparatus illustrated in FIG. 1.
Trisilylamine: 100 sccm
Hydrogen: 500 sccm
Nitrogen: 1000 sccm
Process helium: 1400 sccm
Sealed helium: 500 seem
Argon: 500 sccm
Substrate temperature: 250, 350, 400° C.
High frequency RF power (a frequency of 13.56 MHz): 0.142 W/cm$^2$ (100 W)
Low frequency RF power (a frequency of 430 kHz): 0~100% of high frequency RF power
Trisilylamine supply time: 0.3 sec supply, 2.0 sec supply stop FIG. 5 is a graph showing the stress changes of deposited films which were deposited under the conditions described above. The films were deposited under a variety of different LRF power and substrate temperature conditions. The deposited films have stress values ranging from −921.8 MPa (compressive) to 669.4 MPa (tensile) at 250° C., from −1684 MPa (compressive) to 966 MPa (tensile) at 350° C., and from −2108 MPa (compressive) to 887.2 MPa (tensile) at 400° C.

Figure 6A:
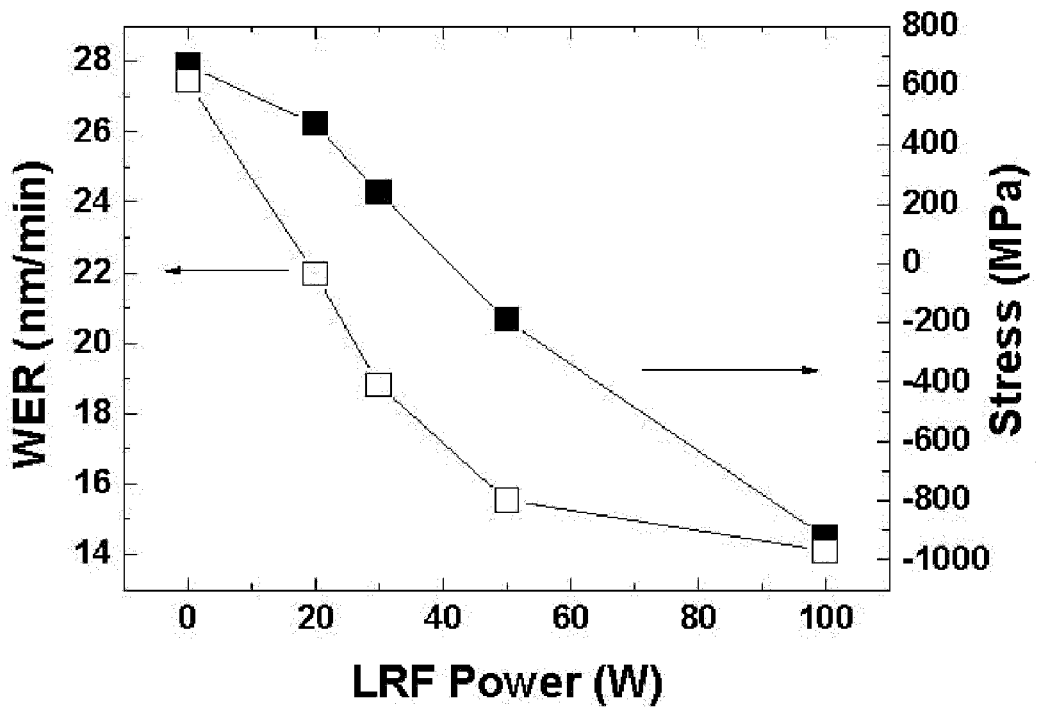
FIG. 6A is a graph showing the relation between wet etch rate (nm/min) and film stress (MPa) in relation to LRF power (W) with an HRF of 0.142 W/cm$^2$ at a substrate temperature of 250° C.
Figure 6B:
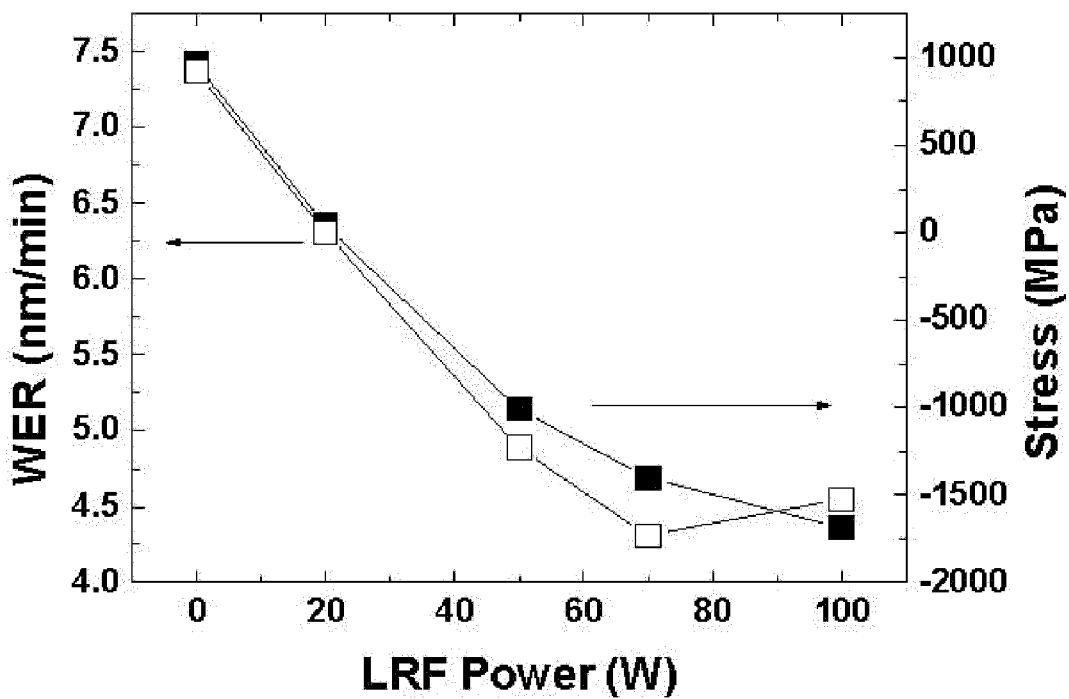
FIG. 6B is a graph showing the relation between wet etch rate (nm/min) and film stress (MPa) in relation to LRF power (W) with an HRF of 0.142 W/cm$^2$ at a substrate temperature of 350° C.
Figure 6C:
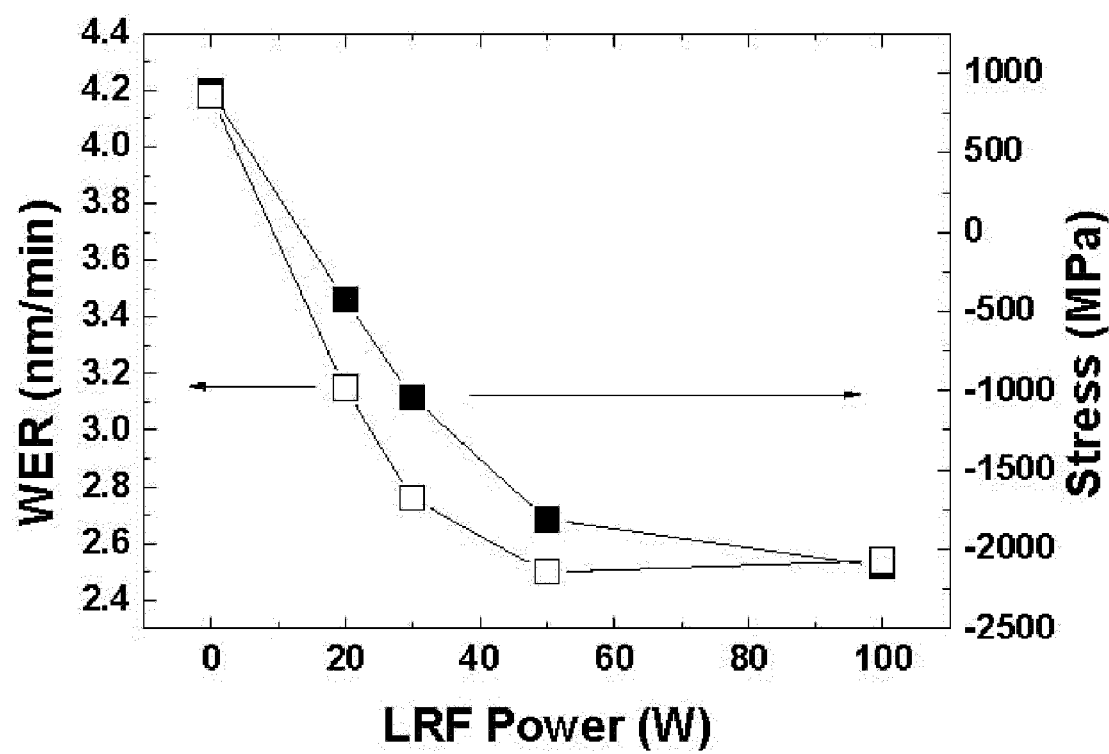
FIG. 6C is a graph showing the relation between wet etch rate (nm/min) and film stress (MPa) in relation to LRF power (W) with an HRF of 0.142 W/cm$^2$ at a substrate temperature of 400° C.

FIGS. 6A to 6C indicate that the relations between wet etch rate and stress with an HRF of 0.142 W/cm$^2$ in combination with different LRF power intensities (FIGS. 6A, 6B, and 6C represent substrate temperatures of 250° C., 350° C., and 400° C., respectively). The stress of deposited films is changed gradually and constantly from tensile to compressive by increasing LRF power, regardless of the substrate temperatures. Also, the etch rate of films is decreased as stress is decreased from tensile to compressive (by increasing LRF power).

Figure 7:
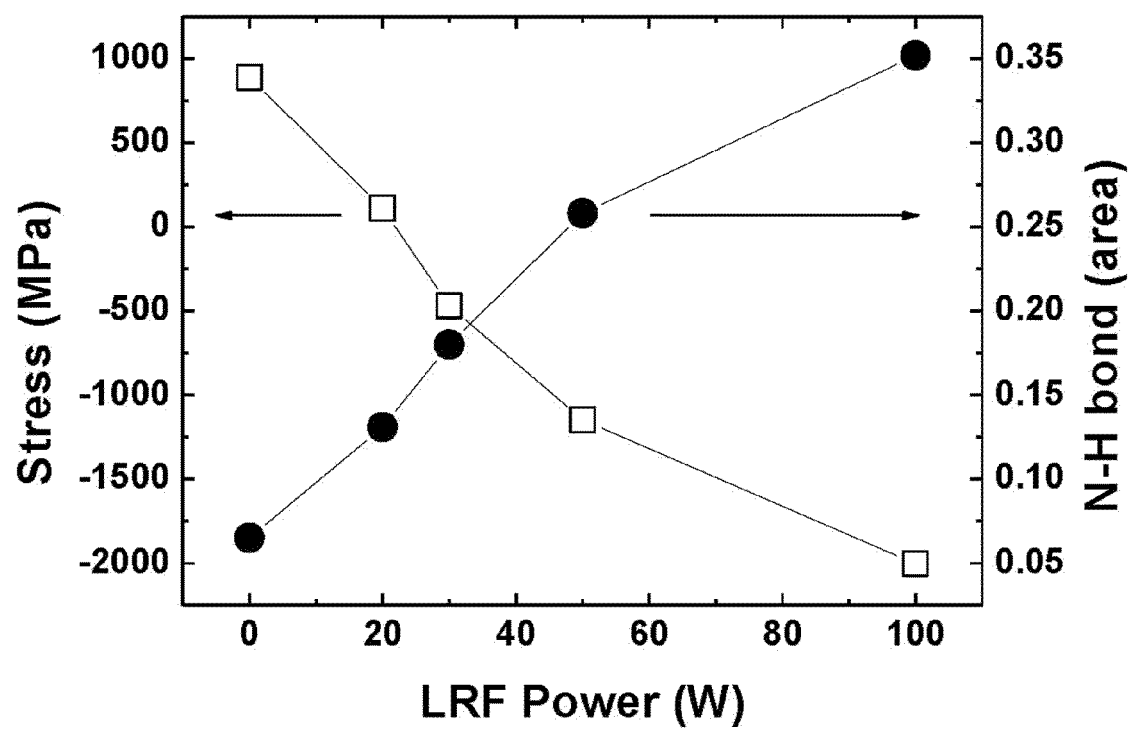
FIG. 7 is a graph showing the relation between stress (MPa) and N—H bond area in relation to LRF power (W).

FIG. 7 is a graph showing the stress and N—H bond area of deposited films with different LRF power conditions. N—H bond area was measured by FTIR spectra (not shown). N—H structures are increased by increasing LRF power. These structures in deposited films are responsible for the compressive state. As the quantity of these structures is reduced, the stress becomes increasingly tensile.

As described above, a significant advantage of the method according to at least one of the disclosed embodiments of the present invention is that stress-tuned silicon nitride layers or other Si—N dielectric layers can be formed on semiconductor substrates simply by manipulating the ratio of LRF power to HRF power without substantially changing the other control parameters. In a similar mariner, wet etch rates of films can be adjusted. In other words, the stress is tunable between tensile and compressive simply by adjusting the ratio of LRF power to HRF power. Thus, film structures which require lamination of films having different stress and/or different wet etch rates, such as n-p channel MOSFET devices, can easily be produced with high productivity. The silicon nitride layers and other Si—N dielectric layers may also be formed at relatively low substrate temperatures, thereby increasing productivity without the occurrence of thermal damage to the substrate, and expanding the types of applicable substrates. In addition, the method according to an embodiment of the present invention can control thickness precisely, and achieve high deposition rates, and can achieve high conformal structures.

The present invention includes, but is not limited to, the following embodiments in addition to the embodiments described above.

1) A method of forming a stress-tuned dielectric film having Si—N bonds on a semiconductor substrate by modified plasma enhanced atomic layer deposition (PEALD), which comprise: (i) introducing a nitrogen- and hydrogen-containing reactive gas and an additive gas into a reaction space inside which a semiconductor substrate is placed; (ii) applying RF power to the reaction space using a high frequency RF power source and a low frequency RF power source; and (iii) introducing a hydrogen-containing silicon precursor in pulses of less than 5 second duration into the reaction space wherein a plasma is excited, thereby forming a stress-tuned dielectric film having Si—N bonds on the substrate.

2) The method according to 1), wherein the high frequency RF power source supplies high frequency RF power having a frequency of about 13.56 MHz or about 27 MHz and the low frequency RF power supplies low frequency RF power having a frequency in a range of about 400 kHz to about 500 kHz.

3) The method according to 1) or 2), wherein the high frequency RF power source supplies high frequency RF power in a range of 0.04 W/cm$^2$ to about 0.15 W/cm$^2$.

4) The method according to any of 1) to 3), wherein the low frequency RF power source supplies low frequency RF power which is 100% or less or 0% of the high frequency RF power supplied by the high frequency RF power.

5) The method according to any of 1) to 4), wherein the substrate is kept at a temperature of 0° C. to 400° C. while depositing the film thereon.

6) The method according to any of 1) to 5), wherein the hydrogen-containing silicon precursor has a formula of Si$_\alpha$H$_\beta$X$_\gamma$ wherein α, β and γ are integers and γ includes zero, and X comprises N and/or C$_m$H$_n$, wherein m and n are integers.

7) The method according to any of 1) to 6), wherein the hydrogen-containing silicon precursor is introduced in pulses while continuously introducing the reactive gas and the additive gas and continuously applying the RF power.

8) The method according to any of 1) to 7), wherein the hydrogen-containing silicon precursor is introduced in pulses having a pulse duration of about 0.1 sec to about 1.0 sec with an interval of about 0.1 sec to about 3.0 sec.

9) The method according to 8), wherein the pulse duration is equal to or shorter than the interval.

10) The method according to any of 1) to 9), wherein the reactive gas is at least one selected from the group consisting of a mixture of N$_2$ and H$_2$, a mixture of NH$_3$ and H$_2$, and a nitrogen-boron-hydrogen gas.

11) The method according to 10), wherein the reactive gas is the mixture of N$_2$ and H$_2$ wherein a molar flow rate ratio of N$_2$/H$_2$ in the mixture is about 1/1 to about 10/1.

12) The method according to 10), wherein the reactive gas is the mixture of NH$_3$ and H$_2$ wherein a molar flow rate ratio of NH$_3$/H$_2$ in the mixture is about 1/1 to about 1/10.

13) The method according to any of 1) to 12), wherein the additive gas is at least one selected from the group consisting of a mixture of helium and argon and a mixture of helium and krypton.

14) The method according to 13), wherein the additive gas is the mixture of helium and argon wherein a molar flow rate ratio of helium/argon is about 3/1 to about 20/1.

15) The method according to 13), wherein the additive gas is the mixture of helium and krypTorr wherein a molar flow rate ratio of helium/krypTorr is about 3/1 to about 20/1.

16) The method according to any of 1) to 15), wherein the stress-tuned dielectric film having Si—N bonds is formed on the semiconductor substrate at a thickness of about 1 Å to about 10 Å per deposition cycle.

17) The method according to any of 1) to 16), wherein the stress-tuned dielectric film depositing n the substrate has a film stress of about −2.0 GPa to about +1.5 GPa.

18) The method according to any of 1) to 17), wherein the stress-tuned dielectric film is a silicon nitride film.

19) The method according to any of 1) to 18), wherein the stress-tuned dielectric film depositing on the substrate has a step coverage or conformality of at least 80%.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a target dielectric film having Si—N bonds constituting a main structure of the film on a semiconductor substrate by plasma enhanced atomic layer deposition (PEALD), said target dielectric film having stress which is either tensile or compressive as its stress type which is opposite to a stress type of a reference dielectric film having Si—N bonds constituting a main structure of the film on a semiconductor substrate by PEALD, comprising:
 (i) introducing a reactive gas containing nitrogen and hydrogen, and a rare gas into a reaction space inside which the semiconductor substrate is placed;
 (ii) applying to the reaction space RF power which is a mixture of low-frequency RF power (LRF) and high-frequency RF power (HRF) at a ratio of LRF/HRF to obtain the target dielectric film having the stress type opposite to that of the reference dielectric film, said ratio being set by increasing a ratio of LRF/HRF used for the reference dielectric film when the stress type of the reference dielectric film is tensile, or by decreasing a ratio of LRF/HRF used for the reference dielectric film when the stress type of the reference dielectric film is compressive; and
 (iii) introducing a hydrogen-containing silicon precursor in pulses into the reaction space while the RF power is applied, thereby forming by PEALD the target dielectric film on the semiconductor substrate, wherein as a result of the set ratio, the target dielectric film has the stress type opposite to that of the reference dielectric film.

2. The method according to claim 1, wherein the ratio of LRF/HRF is a primary parameter for controlling the stress type of the target dielectric film.

3. The method according to claim 2, wherein the ratio of LRF/HRF is the sole parameter for controlling the stress type of the target dielectric film.

4. The method according to claim 1, wherein the target dielectric film has compressive film stress, and in step (ii), the ratio of LRF/HRF is set by increasing the ratio of LRF/HRF used for the reference dielectric film, wherein the increased ratio of LRF/HRF is 2/10 to 10/10.

5. The method according to claim 1, wherein the target dielectric film has tensile film stress, and in step (ii), the ratio of LRF/HRF is set by decreasing the ratio of LRF/HRF used for the reference dielectric film, wherein the decreased ratio of LRF/HRF is 0/10 to 4/10.

6. The method according to claim 1, wherein the hydrogen-containing silicon precursor is introduced in pulses having a pulse duration of about 0.1 sec to about 1.0 sec with an interval of about 0.5 sec to about 3 sec while forming the films.

7. A method of forming a target dielectric film having Si—N bonds constituting a main structure of the film on a semiconductor substrate by plasma enhanced atomic layer deposition (PEALD), said target dielectric film having a film stress value different from that of a reference dielectric film having Si—N bonds constituting a main structure of the film on a semiconductor substrate by PEALD, comprising:
  (i) introducing a reactive gas containing nitrogen and hydrogen, and a rare gas into a reaction space inside which the semiconductor substrate is placed;
  (ii) applying to the reaction space RF power which is a mixture of low-frequency RF power (LRF) and high-frequency RF power (HRF) at a ratio of LRF/HRF to obtain the stress type opposite to that of the reference dielectric film, said ratio being set by increasing a ratio of LRF/HRF used for the reference dielectric film to obtain the target dielectric film having a film stress value which is lower than that of the reference dielectric film, or by decreasing a ratio of LRF/HRF used for the reference dielectric film to obtain a film stress value which is higher than that of the reference dielectric film; and
  (iii) introducing a hydrogen-containing silicon precursor in pulses into the reaction space while the RF power is applied, thereby forming by PEALD the target dielectric film on the semiconductor substrate, wherein the ratio of LRF/HRF is used as a primary parameter for differentiating the film stress value of the target dielectric film from that of the reference dielectric film.

8. The method according to claim 7, wherein the ratio of LRF/HRF is the sole parameter for differentiating the film stress value of the target dielectric film.

9. A method of forming multiple dielectric films each having Si—N bonds constituting a main structure of the film on a semiconductor substrate by plasma enhanced atomic layer deposition (PEALD), wherein the multiple dielectric films include a tensile stress film and a compressive stress film, said method comprising:
  (i) introducing a reactive gas containing nitrogen and hydrogen, and a rare gas into a reaction space inside which the semiconductor substrate is placed;
  (ii) applying to the reaction space RF power which is a mixture of low-frequency RF power (LRF) and high-frequency RF power (HRF) at a ratio of LRF/HRF;
  (iii) introducing a hydrogen-containing silicon precursor in pulses into the reaction space while the RF power is applied, thereby forming by PEALD one of the tensile and compressive stress films on the semiconductor substrate; and
  (iv) as a primary parameter for controlling stress of the depositing film, changing the ratio of LRF/HRF, and repeating steps (i) to (iii) at the changed ratio of LRF/HRF, thereby forming another of the tensile and compressive stress films on the semiconductor substrate.

10. The method according to claim 9, wherein the changing of the ratio of LRF/HRF is increasing the ratio of LRF/HRF wherein the another of the tensile or compressive stress films is the compressive stress film.

11. The method according to claim 10, wherein the increased ratio of LRF/HRF is 2/10 to 10/10.

12. The method according to claim 9, wherein the changing of the ratio of LRF/HRF is decreasing the ratio of LRF/HRF wherein the another of the tensile or compressive stress films is the tensile stress film.

13. The method according to claim 12, wherein the decreased ratio of LRF/HRF is 0/10 to 4/10.

14. The method according to claim 9, further comprising, as a secondary parameter for controlling stress of the depositing film, changing a ratio of nitrogen to hydrogen in the reactive gas in step (iv).

15. The method according to claim 9, further comprising, as a secondary parameter for controlling stress of the depositing film, changing quantity of the HRF in step (iv).

16. The method according to claim 9, wherein the hydrogen-containing silicon precursor is composed of a combination of silicon and hydrogen; a combination of silicon, hydrogen, and nitrogen; or a combination of silicon, hydrogen, carbon, and nitrogen.

17. The method according to claim 16, wherein the reaction gas is a combination of nitrogen gas and hydrogen gas or a combination of ammonia gas and hydrogen gas.

18. The method according to claim 9, wherein the hydrogen-containing silicon precursor is introduced in pulses having a pulse duration of about 0.1 sec to about 1.0 sec with an interval of about 0.5 sec to about 3 sec while forming the films.

19. The method according to claim 9, wherein the reactive gas, the rare gas, and the hydrogen-containing silicon precursor are different from each other.

20. The method according to claim 9, wherein a molar flow rate of the rare gas is greater than a molar flow rate of the hydrogen-containing silicon source.

* * * * *